(12) United States Patent
Geifman et al.

(10) Patent No.: US 7,268,549 B2
(45) Date of Patent: Sep. 11, 2007

(54) MAGNETIC RESONANCE SPECTROMETER

(75) Inventors: Ilia Natanovich Geifman, Glenview, IL (US); Irina Sergeevna Golovina, Kiev (UA)

(73) Assignee: Electroplated Metal Solutions, Elk Grove Village, IL (US)

( * ) Notice: Subject to any disclaimer, the term of this patent is extended or adjusted under 35 U.S.C. 154(b) by 0 days.

(21) Appl. No.: 11/306,694

(22) Filed: Jan. 7, 2006

(65) Prior Publication Data
US 2006/0197529 A1  Sep. 7, 2006

Related U.S. Application Data

(63) Continuation-in-part of application No. 10/605,251, filed on Sep. 18, 2003, now abandoned.

(51) Int. Cl.
*G01V 3/00* (2006.01)
(52) U.S. Cl. ..................... 324/316; 324/318
(58) Field of Classification Search ............... 324/316, 324/318
See application file for complete search history.

(56) References Cited

U.S. PATENT DOCUMENTS

| | | | |
|---|---|---|---|
| 3,582,778 A | 6/1971 | Faulkner | 324/0.5 |
| 3,931,569 A | 1/1976 | Hyde | 324/0.5 A |
| 5,160,890 A | 11/1992 | Roschmann | 324/314 |
| 5,465,047 A * | 11/1995 | Nakanishi et al. | 324/316 |
| 2002/0000806 A1 | 1/2002 | Nakamura et al. | 324/315 |
| 2002/0153895 A1* | 10/2002 | Hasegawa | 324/322 |
| 2003/0038633 A1* | 2/2003 | Hyde et al. | 324/316 |

* cited by examiner

*Primary Examiner*—Brij Shrivastav
*Assistant Examiner*—Megann E Vaughn
(74) *Attorney, Agent, or Firm*—Leonid Khodor

(57) ABSTRACT

EPR spectrometer comprising a ferroelectric single crystal resonator, a rectangular channel with holes in its narrow sides for inserting a sample and wires, a permanent magnet with planar poles, and a coil within the channel connected through the holes by the wires with a modulation source and a NMR spectrometer comprising a magnet, a probe with means for transmitting a radio frequency magnetic pulse and detecting NMR signal, and a ferroelectric single crystal resonator. A ferroelectric single crystal consisting essentially of potassium tantalate and the alkali metal substituting from about 1% to 3% of potassium or a group (V) metal substituting in part for tantalum, having cubic form of perovskite crystalline structure, and essentially free of impurities and defects is also disclosed.

17 Claims, 4 Drawing Sheets

MAGNETIC RESONANCE SPECTROMETER

This application is a continuation-in-part of our application Ser. No. 10/605,251, filed Sep. 18, 2003, now abandoned

FIELD OF INVENTION

This invention generally relates to the field of magnetic resonance instruments, such as EPR and NMR spectrometers. This invention also relates to the field of fabrication and use of ferroelectric single crystal resonators, in particular, to single crystal microwave resonators including, or consisting essentially of, potassium tantalate and methods for preparation and use thereof.

BACKGROUND OF INVENTION

Electron Paramagnetic Resonance (EPR) is widely employed in various applications in the fields of physics, chemistry, medicine and biology. Historically, EPR was used primarily to study samples doped with paramagnetic ions, rather than substantially pure samples. In order to study the samples whose physical properties are unaffected by dopant impurities, particularly samples of materials with low concentration of paramagnetic centers, however, the spectrometer sensitivity, i.e. its signal-to-noise (S/N) ratio had to be increased.

One of the conventionally used techniques of increasing signal-to-noise (S/N) ratio of the EPR spectrometer entails placing the dielectric material inside a resonator. For example, disposing a quartz plate proximal to the sample in one instance increased the S/N ratio about 4.5 times. Further, increasing intensity of the EPR signal can be obtained by using a ferroelectric material as a microwave resonator. For instance, rutile ($TiO_2$) rectangular resonator has been used to increase $Fe^{3+}$ EPR spectrum. Dielectric resonators fabricated from $TiO_2$ and $SrTiO_3$ (these materials have anisotropic permittivity) were used only for increasing the EPR signal intensities of paramagnetic centers inside themselves.

Conventional EPR spectrometers generally include a high Q resonant metal cavity. The high Q cavity requires a high ratio of the cavity volume to the cavity wall surface, which, in turn, necessitates a relatively large volume of polarizing magnetic field, thereby requiring a large magnet, e.g. the magnet weighing 1000 kg or more. These spectrometers have been designed as highly sensitive and versatile instruments for a broad variety of applications. As a result, conventional spectrometers are relatively expensive and bulky, and are typically used as stationary equipment in research laboratories.

Other techniques rely on inserting a ferroelectric object, i.e. a resonator, into a standard cavity of the EPR spectrometer to alter intensities of a continuous wave ("CW") EPR signal and Pulse EPR echo (see, e.g., an article by I. N. Geifman, I. S. Golovina, V. I. Kofman, and E. R. Zusmanov, Ferroelectrics, Vol. 234 (1-4), pp. 81-88 (1999), incorporated herein by reference). Thusly configured resonating structures are suitable for analyzing a wide variety of materials. Ferroelectric $KTaO_3$ resonators described by Geifman and his co-authors are capable of increasing S/N ratio ten times at room temperature for a rectangular resonator in CW EPR experiments and reducing microwave power by a factor of 50 at 50 K in an electron spin echo (ESE) experiment. Among other advantages, these resonators have isotropic dielectric constant, and low dielectric losses. Although these ferroelectric resonators have increased sensitivity, as well as much smaller dimensions in comparison with the conventional dielectric resonators mentioned above and can be utilized with liquid and solid samples of a wide range of materials, they still operate as mere "amplifiers" within the conventional EPR cavity and, actually, is a feature of the sample rather than a part of the spectrometer.

Some conventional EPR spectrometers, e.g. the one disclosed in U.S. Pat. No. 3,931,569, were designed from the point of view of arriving at a high sensitivity instrument for examining aqueous samples or other liquid samples of relatively high dielectric loss at room temperature. As is well known, the polarizing magnetic field for electron paramagnetic resonance is parallel to a cavity dimension that corresponds to the zero index, and the magnitude of this cavity dimension does not affect the resonant frequency of the cavity. In this case, the cavity dimension corresponding to the zero index is made small, of the order of an optimum capillary sample tube outer diameter, i.e., 2 mm if the diameter is 1 mm, for apparatus designed to operate at 10 GHz. It has been found that the sensitivity of the spectrometer is as high as that obtained from high Q cavities of conventional design where the dimension corresponding to the zero index is typically 15 mm at 10 GHz. The design is directed particularly to EPR spectrometers utilizing rectangular $TE_{102}$ or cylindrical $TM_{110}$ modes and provides low-cost apparatus for a very restricted range of applications. The low Q resonant cavity can be applied to analyze aqueous samples only.

Although Nuclear Magnetic Resonance (NMR) devices, due to frequency range lower relative to EPR, have a radio frequency (RF) coil instead of the cavity as the resonator, fundamental dependencies remain between the resonator size and the device capabilities, complexity, size, and cost. The dependencies equally affect NMR spectrometers, MASERs, probes and, generally, any device with the RF coil.

NMR spectrometers have now become very complex instruments capable of performing sophisticated experiments. However, conceptually, broken down to its simplest form, the spectrometer consists of an intense, homogeneous, and stable magnetic field; a "probe", which enables RF coils to be placed close to a sample; a RF transmitter capable of delivering short pulses; a receiver to amplify the NMR signals; a digitizer to convert the NMR signals into a form, which can be stored in computer memory; a "pulse programmer" to produce precisely timed pulses and delays; as well as means for controlling and processing data.

As described in more detail below, in its various embodiments, the present invention relates to the probe of the NMR spectrometer. As the static magnetic field generating magnet in the NMR spectrometer, a resistive magnet of 0.5 to 2.2 T or a superconducting magnet of 0.5 to 18.8 T, as well as, in some cases, a permanent magnet have been used. Modern NMR spectrometers use persistent superconducting magnets to generate the $B_0$ field. Basically such a magnet consists of a coil of wire through which a current passes, thereby generating a magnetic field. The wire is of a special construction such that at low temperatures (less than 6 K, typically) the resistance goes to zero, so the wire is superconductor. Thus, once the current is set running in the coil it will persist for ever, thereby generating a magnetic field without the need for further electrical power. Superconducting magnets tend to be very stable and so are very useful for NMR. To maintain the wire in its superconducting state the coil is immersed in a bath of liquid helium. Surrounding this is a "heat shield" kept at 77 K by contact with a bath of liquid nitrogen; this reduces the amount of expensive liquid helium, which boils off due to heat flowing in from the surroundings. The whole assembly is constructed in a vacuum flask so as to further reduce the heat flow.

There is a sample region accessible to the outside environment. The region has to be engineered as part of the design of the magnet and, conventionally, it takes the form of a vertical tube passing through the magnet (called the bore tube of the magnet); the magnetic field is in the direction of this tube.

The lines in NMR spectra are very narrow. Line widths of 1 Hz or less are not uncommon so the magnetic field has to be extremely homogeneous for work at this resolution. For example, a proton spectrum recorded at 500 MHz requires variations, which, expressed as a fraction of the main magnetic field, are no more than $2\times10^{-10}$. On its own, no superconducting magnet can produce such a homogeneous field. Thus the sample is surrounded with a set of shim coils, each of which produces a tiny magnetic field with a particular spatial profile. The current through each of these coils is adjusted until the magnetic field has the required homogeneity. Essentially, the magnetic fields produced by the shims are canceling out the small residual variations in the main magnetic field. Modern spectrometers might have up to 40 different shim coils, so adjusting them is a very complex task. Moreover, even after set on installation, it is usually necessary on a day-to-day basis to alter a few of the shims. The shims are labeled according to the magnetic field profiles they generate. The field profiles that the shims coils create are, in fact, the spherical harmonic functions, which are the angular parts of the atomic orbital.

The probe is a cylindrical metal tube, which is inserted into the bore tube of the magnet. Small RF coil used to both excite and detect the NMR signal is held in the top of this assembly in such a way that the sample can come down from the top of the magnet and drop into the coil. Various other pieces of electronics are contained in the probe, along with some arrangements for heating or cooling the sample. The key part of the probe is the small coil used to excite and detect the magnetization. To optimize the sensitivity this coil needs to be as close as possible to the sample. Extraordinary effort has been put into the optimization of the design of this coil.

The coil forms a part of a tuned circuit consisting of the coil and a capacitor. The inductance of the coil and the capacitance of the capacitor are set such that the circuit they form is resonant at the Larmor frequency. "Tuning the probe" means adjusting the capacitor until the tuned circuit is resonant. Usually, it is also needed to "match the probe", which involves further adjustments designed to maximize the power transfer between the probe and the transmitter and receiver. The two adjustments tend to interact rather, so tuning the probe is a tricky process. To aid it, the instrument manufacturers provide various indicators and displays so that the tuning and matching can be optimized. The tuning of the probe is particularly sensitive to changing solvent or to changing the concentration of ions in the solvent.

Ferroelectric crystals are materials, characterized by high dielectric constant ($\epsilon$). Certain binary metal oxides, particularly oxides of combinations of alkali with group (V) metals and of alkaline earth with group (IV) metals are ferroelectrics. A potassium tantalate crystal is unique among ferroelectrics because it combines, in spite of the lowering temperature, the rising considerably isotropic dielectric constant, which reaches 4000 at approximately 4.2° K. with decreasing dielectric losses. These features provide for resonators of high quality (Q) even under super low temperature conditions. The potassium tantalate single crystal is the promising material for radio frequency and microwave resonators and, as a result, for EPR and NMR applications including spectroscopy and imaging (MRI).

It has been known that ferroelectrics in general and especially a potassium tantalate single crystal can improve an EPR spectrometer performance that provides for a possibility of decreasing size and cost of spectrometers. However, a single crystal of the nominally pure potassium tantalate most often shows EPR spectra of iron ($Fe^{3+}$), which is present in the crystal as an uncontrolled impurity. Therefore, when used as a resonator, the crystal carries own background EPR signal that overlaps sample spectra. Furthermore, other possible impurities and structural defects further limit usefulness of the crystal.

An EPR resonator made of single crystal potassium tantalate doped with lithium (Li), which replaces 0.01-0.1% of potassium disclosed in UA Pat. No. 40178A. The crystal characterized by absence of the background signal, decreasing irregularities, and stronger crystal lattice. Nonetheless, the resonator is of limited use for EPR applications because, at low temperatures, the crystal walls surrounding a central hole for a sample are becoming too thin to sustain stresses of a microwave field. Alternatively, NMR applications, due to lower frequency range, require radically greater size of the resonator, its $\epsilon$, or both.

Traditionally, variations of Czochralski method is used for growing sizable ferroelectric single crystals in general and potassium tantalate single crystals in particular. Different means are employed for achieving desired crystal parameters. Particularly, controlling melt component relative quantities, temperature, temperature gradient, flow direction and intensity; growing in the air, special atmosphere, or vacuum; manipulating seed lifting speed, rotational direction and velocity have been known in the art.

However, almost each chemical composition requires its own set of conditions for growing single crystals of satisfactory quality. Finding right conditions for growing a particular crystal remains as much an art as a science. Thus, there remains an unresolved need in the art for an improved method of producing ferroelectric potassium tantalate single crystal having cubic form of perovskite crystalline structure and is essentially free of impurities and defects.

Thus, there remains an unresolved need in the art for improved EPR and NMR frequency resonators as well as for improved devices that utilize EPR and NMR methods, in particular EPR and NMR spectrometers.

SUMMARY OF INVENTION

It is an object of the present invention to provide an improved EPR spectrometer.

It is also object of the present invention to provide an improved NMR spectrometer.

It is another object of the present invention to provide a microwave resonator comprising the single crystal with predictable and consistent properties that is useful in a number of EPR and NMR applications.

It is yet another object of the present invention to produce a ferroelectric single crystal consisting essentially of the potassium tantalate and the alkali metal or the group (V) metal having reproducible physical properties and to provide efficient and reliable method of preparation of such ferroelectric single crystal.

Accordingly, improved EPR and NMR spectrometers are disclosed herein. Also, disclosed herein are a ferroelectric single crystal resonator and methods for preparation of such ferroelectric single crystal that provide for exclusion of impurities and defects.

In general, a key aspect of embodiments of the invention features an EPR spectrometer comprising a channel having generally opposing wide sides and narrow sides, a sample hole and at least one connection hole through at least one of said narrow sides, a polarizing magnet having first and second poles having at least one substantially planar surface disposed parallel and in close proximity to each of the wide sides, a ferroelectric single crystal resonator having a through hole, and an excitation coil disposed within said channel generally surrounding the resonator. The polarizing magnet disposed generally over the channel such that the planar surfaces of the magnet poles are disposed substantially parallel and in close proximity to each of the wide sides. The resonator disposed within the channel generally between the magnet poles with the through hole substantially coaxial with the sample hole for receiving a sample there through, and the coil being in electric communication with an AC generator through connecting wires passing through said at least one connection hole.

Also, the narrow sides of the channel of the EPR spectrometer are substantially perpendicular to the wide sides.

In another aspect according to embodiments of the invention, the ferroelectric single crystal resonator of the EPR spectrometer is a single crystal comprised of the potassium tantalite, $KTaO_3$. In some embodiments, about 1% to about 3% of potassium in the single crystal is substituted with lithium, thereby forming a $K_{(0.97-0.99)}Li_{(0.03-0.01)}TaO_3$ composition of said single crystal. The ferroelectric single crystal resonator may have a shape substantially symmetrical relative to three mutually perpendicular planes and axes.

In general, the EPR spectrometer includes a microwave generator as an energy source. In one of embodiments of the invention, the Gunn oscillator having a frequency of 9.4 GHz was employed. In accordance with embodiments of the present invention, the EPR spectrometer comprises means for detecting the electron paramagnetic resonance of a sample. In some embodiments they are a balance mixer and a detector diode for detecting the EPR of the sample.

Generally, in yet another aspect, in embodiments of the invention, the EPR spectrometer has means for branching microwave energy from the microwave generator to the ferroelectric single crystal resonator and to the means for detecting the electron paramagnetic resonance of a sample. In some embodiments a valve and a directed branching couple the energy.

In further aspect, the EPR spectrometer features means for conducting microwave energy from the means for branching microwave energy to the ferroelectric resonator, from the ferroelectric resonator to the means for detecting the electron paramagnetic resonance of the sample, and from the means for branching microwave energy to said means for detecting the electron paramagnetic resonance. In some embodiments of the present invention the EPR spectrometer comprises wave guides connecting the channel to the directed branching and to the EPR detecting means and a wave guide connecting the directed branching to the EPR detecting means.

In general, in another aspect, embodiments of the invention feature an NMR spectrometer comprising a magnet for generating a static homogeneous magnetic field, a probe disposed within the magnetic field and having means for transmitting a radio frequency magnetic pulse and detecting NMR signal, and a ferroelectric single crystal resonator positioned within said probe, having a through hole for receiving a sample there through. A ratio of a resonant frequency of the ferroelectric resonator and an NMR spectrometer frequency is substantially an integer. The resonator is characterized by a shape substantially symmetrical relative to three mutually perpendicular planes and axes. According to embodiments of the invention, the probe has an axis and said probe, the resonator, and the hole are substantially coaxial with an axis of the static homogeneous magnetic field of the NMR spectrometer.

In general, in yet another aspect, embodiments of the invention feature the NMR spectrometer wherein said ferroelectric single crystal resonator is a single crystal comprising the potassium tantalite, where a part of the tantalum is substituted with the group (V) metal. Furthermore, in some embodiments, said group (V) metal is niobium, which substitutes of up to about 40% of tantalum, thereby forming a $KNb_{(0-0.4)}Ta_{(1-0.6)}O_3$ composition. Also, up to 0.1% of potassium in said single crystal may be substituted with lithium.

In general, in further aspect, the present invention involves preparation of a ferroelectric resonator from a single crystal consisting essentially of the potassium tantalate and the alkali metal or the group (V) metal produced by a process of a chemical reaction in a melt between the potassium precursor, the tantalum oxide and the alkali metal precursor or the group (V) metal oxide followed by contacting the melt surface with a seed crystal, lifting the seed crystal to grow a single crystal, separating the grown single crystal from the melt, and cooling the single crystal to the ambient temperature.

Accordingly, some embodiment of the invention feature a method of production a ferroelectric single crystal consisting essentially of the potassium tantalate and the alkali metal substituting from about 1% to about 3% of the potassium or the group (V) metal substituting in part for the tantalum that includes providing the potassium precursor, a tantalum foil, and the alkali metal precursor or a group (V) metal foil, burning said tantalum foil in oxygen, if said group (V) metal required, burning said group (V) metal foil in oxygen, creating a mixture of said potassium precursor, the tantalum oxide, and said alkali metal precursor or the group (V) metal oxide. The method further entails heating said mixture in a crucible to obtain a melt, contacting a lower end of a seed crystal with a surface of said melt, lifting without rotation said seed crystal to grow a single crystal, wherein said crucible is not moved, and separating the grown single crystal from said melt. The method concludes with cooling said single crystal to the ambient temperature.

DETAILED DESCRIPTION

Figure 1:
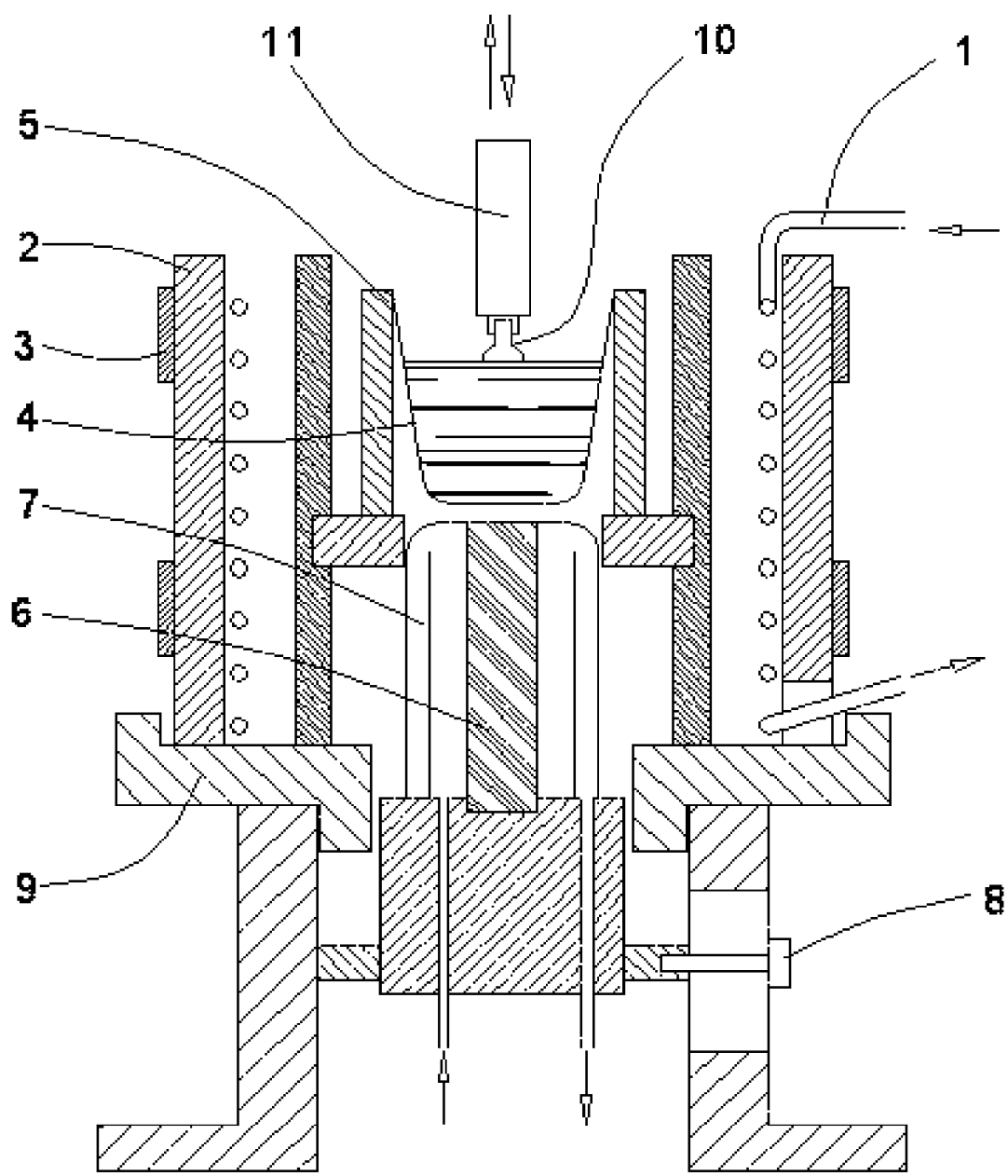
FIG. 1 depicts a schematic drawing of an apparatus for producing the single crystal.

In its various embodiments, the present invention focuses on an EPR spectrometer utilizing rectangular $TE_{10}\delta$ or cylindrical $TM_{11}\delta$ modes of a ferroelectric resonator, although it can be extended readily to $TM_{mn}\delta$ modes where m and n are any integers and to other modes as well. As is well known, EPR polarizing magnetic field is parallel to a resonator dimension that corresponds to the zero ($TE_{10}$) index and the magnitude of it does not affect the resonant frequency. In accordance with the present invention the ferroelectric resonator dimensions are approximately 1.9×1.9×3.1 mm. So, the channel dimension corresponding to the zero index is made small, in the order of the corresponding dimension of the ferroelectric resonator. Optimum dimension of the channel in the zero direction is about 2.5 mm for the spectrometer designed to operate at 10 GHz.

In another aspect, this invention relates to an NMR spectrometer utilizing a ferroelectric resonator. According to an embodiment of the present invention, the resonator having own resonant frequency, which is multiple of a resonant frequency of the NMR spectrometer, increases sensitivity of the spectrometer. The greatest increase of the signal-to-noise ratio occurs when the resonator own resonant frequency is equal to the frequency of the NMR spectrometer.

In yet another aspect, this invention is directed to producing of single crystal resonators for frequencies from about 60 MHz to about 15 GHz and methods of use thereof. Generally, the microwave resonator can be straight or curved, smooth or rough, thin or thick, solid or hollow. Although the single crystal in the microwave resonator can have any shape, preferred shapes are symmetrical relative to three mutually perpendicular planes and axes, for example, a cylinder or a hollow cylinder. The most preferable is a tetragonal prism with or without a hole along one of the axis. The preference is based on the crystal lattice, manufacturability, simplicity of calculations, and good correlation between calculations and empirical data. Methods and equations for calculating of the resonator dimensions are known in the art.

As used herein, the term "single crystal resonator" refers to a part fabricated from a single crystal of doped potassium tantalate. In one embodiment of the invention, the microwave resonator for 10 GHz (EPR) has 1.9×1.9×3.1 mm dimensions with an Ø1 mm hole through centers of square sides. In another embodiment of the invention, the microwave resonator for 300 MHz (NMR) has 5.7×5.7×8 mm dimensions with an Ø1 mm hole through centers of square sides.

In many embodiments, the microwave resonator comprises the single crystal having cubic form of perovskite crystalline structure is essentially free of impurities and defects. In one embodiment of the invention, the single crystal has $K_{(0.97-0.99)}Li_{(0.03-0.01)}TaO_3$ composition. In another embodiment, the single crystal has $KNb_{(0-0.4)}Ta_{(1-0.6)}O_3$ composition. In yet another embodiment, the single crystal with $KNb_{(0-0.4)}Ta_{(1-0.6)}O_3$ composition includes lithium substituting for up to 0.1% of potassium. The microwave resonator can be prepared from the single crystal using one of the manufacturing methods employed currently in the art or a combination thereof. It is important in all cases that the microwave resonator be predictable and stable at the usage temperatures. It is imperative that the microwave resonator does not react chemically with the environment during the manufacture or use of it. The single crystal in the microwave resonator can be either covered with a barrier transparent to resonance frequencies or exposed. One of ordinary skill in the art will realize that other task- and the environment-dependent features can also be employed in conjunction with various embodiments of the claimed invention.

In some embodiments, the method of the single crystal production begins with providing the potassium precursor, a tantalum foil, and the alkali metal precursor or a group (V) metal foil. As used herein, the terms "potassium precursor" and "alkali metal precursor" refer to starting materials for the production of the single crystal of the invention. In one embodiment of the invention, the potassium precursor and the alkali metal precursor are respectively the potassium carbonate $K_2CO_3$ and the lithium carbonate $Li_2CO_3$. In another embodiment, the potassium precursor and the alkali metal precursor are respectively the potassium oxide $K_2O$ and the lithium oxide $Li_2O$.

The method proceeds with heating the tantalum foil in oxygen to the temperature that provides for the synthesis of the tantalum oxide, $Ta_2O_5$ for a period of time that provides for the synthesis to be completed. In one embodiment of the invention, the synthesis is carried out in a quartz tube with the oxygen flow of about 0.1 $m^3/h$ at the temperature about 900° C. for about 2 hours. In another embodiment, the synthesis is carried out in a platinum crucible with the oxygen blown in with a rate of about 0.06 $m^3/h$ at the temperature about 800° C. for about 3 hours.

The method further proceeds with heating the group (V) metal foil, particularly a niobium foil in oxygen to the temperature that provides for the synthesis of the niobium oxide, $Nb_2O_5$ for a period of time that provides for the synthesis to be completed. Conditions for the niobium oxide synthesis are similar to the same for the tantalum oxide.

Next step of the method is creating a mixture of said potassium precursor, said tantalum oxide and said alkali metal precursor or said niobium oxide. Generally, the starting mixture created by thorough sifting, drying, weighting, and blending of the provided components. Because the mixture is hydroscopic, it is kept hermetically sealed. The component proportion in the mixture corresponds to the atomic ratio of the potassium to the tantalum with the group (V) metal is about 1.4 to 1. The proportion of the alkali metal substitute to the substituted potassium in the mixture corresponds to the atomic ratio is about 3 to 1.4 respectively.

An apparatus (FIG. 1) that can be utilized to carry the method further includes a water-cooled inductor 1 surrounded by ferrite plates 2, which held together with rubber rings 3. Platinum crucible 4 is supported at its flared edge by a hollow alumina cylinder 5. A ferrite core 6 enclosed in a water-cooled quartz tube labyrinth 7 heats the crucible 4. A screw 8 fixes the ferrite core 6 relative to the crucible 4 bottom and a centering ring 9 provides radial alignment that guarantees a homogeneous thermal field. A seed crystal 10 that, usually, cut from bulk single crystal is attached with a platinum wire to an alumina rod 11, which can move up and down with the controlled speed. Typically, sides of the seed crystal 10 used for growing are natural facets and the crystal has to be free of defects because they tend to propagate into a growing single crystal.

The method continues with placing the mixture into the crucible 4 and heating it above a melting point. To decrease melting time and energy consumption, it is preferable covering initially the crucible top with a platinum lid that should have an opening for exhausting and an inspection. The melt, generally a solution of $KNbO_3$ and/or $KTaO_3$ in $K_2O$, is fluid, relatively non-viscous liquid. The later, coupled with the melt's ability to withstand the overcooling, provides for less stringent process conditions. In one embodiment of the invention, the method is carried in the open air. In another embodiment of the invention, the apparatus (FIG. 1) is situated in a vacuum chamber and the process is carried in vacuum.

The method proceeds with lowering the seed 10 with the rod 11 onto the melt surface and lifting it back up at the rate of 0.5 to 2 mm/h. At the same time, the melt is cooled down at the rate of 3 to 10° C./h. The seed 10 becomes a part of a growing single crystal. The rod 11 movements are strictly vertical and no rotation is introduced during the lifting. Particular rates of the lifting and the cooling depend on desired size of the single crystal. Slower lifting speed and faster cooling correspond to a greater cross section of the growing single crystal. Duration of the growing is limited by practical considerations.

The method further proceeds with separating the grown crystal from the melt. This is achieved by increasing both the lifting speed up to about 600 mm/h and the melt temperature up to about 1050° C.

Final step of the method is cooling the crystal to the ambient temperature. In one embodiment of the invention, the crystal is removed from the apparatus after it cools down to the ambient temperature naturally. In another embodiment of the invention, the crystal is cooled down at controlled rate of about 90° C./h. In yet another embodiment of the invention, the rod with the crystal is removed from the apparatus after the temperature decreases to less than 500° C. and cools further naturally.

EXAMPLE 1

In one particular instance, the process was carried as follows. Super pure grade of the potassium carbonate $K_2CO_3$ and the lithium carbonate $Li_2CO_3$ and a tantalum foil of analytically pure grade were used. The foil was cut in about 2 mm wide pieces, placed in a quartz tube connected to an oxygen source, heated to above 850° C., and held at this temperature for 2.5 hours with the oxygen flow of about 0.1 $m^3$/h. After the cooling, the tantalum oxide $Ta_2O_5$ was ground in an agate mortar, separately weighted, placed together with other components in a mass proportion of 30.94% $K_2CO_3$, 0.26% $Li_2CO_3$, and 68.8% $Ta_2O_5$, and thoroughly mixed. Then the mixture was placed in the apparatus (FIG. 1). The crucible was 40 mm in diameter and 50 mm high and initially covered with a platinum lid having a T shape slot. The mixture was heated to 1000±30° C. and held for 5 hours at this temperature. The synthesis of $K_{0.98}Li_{0.02}TaO_3$ is illustrated in a equation:

$$343K_2CO_3 + 15Li_2CO_3 + 250Ta_2O_5 \rightarrow 500K_{0.98}Li_{0.02}TaO_3 + 98K_2O + 10Li_2O + 358CO_2.$$

The seed of 1×1×7 mm size with a groove cut across two of the edges was attached to the rod with a platinum wire of 0.3 mm in diameter. The crystal was grown at the rate of about 1.2 mm/h with the melt cooled down at the rate of about 6° C./h. The size of the crystal was approximately 5 mm square and 8.5 mm long.

EXAMPLE 2

In this instance, also, super pure grade of the potassium carbonate $KCO_3$ as well as tantalum and niobium foils of analytically pure grade were used. The tantalum and niobium oxides were prepared under similar to above described conditions. Mass proportion of components was 32.1% $K_2CO_3$, 12.2% $Nb_2O_5$, and 55.7% $Ta_2O_5$. The synthesis of $KNb_{0.2}Ta_{0.8}O_3$ is illustrated in a equation:

$$7K_2CO_3 + 4Ta_2O_5 + Nb_2O_5 \rightarrow 10KNb_{0.2}2K_2O + 7CO_2.$$

It was established that, when the crucible used for the process was previously used for the example 1 process, a small amount of lithium is present in the melt. This phenomenon was exploited here to have the crystal doped with the lithium. The crystal was grown at the rate of about 1.5 mm/h with the melt cooled down at the rate of about 8° C./h. The size of the crystal was approximately 4.5 mm square and 11 mm long. The crystal composition was $K_{0.9998}Li_{0.0002}Nb_{0.2}Ta_{0.8}O_3$.

The crystals produced according to various embodiments of the present invention were studied initially to obtain measurements of temperature dependencies of the dielectric permittivity, dielectric losses and the conductivity, which are necessary to define the impurity content as well as to eliminate conductive crystals. Set up for the measuring of dielectric characteristics contains A.C. bridge—a digital L.C.R gage E7-8. Temperatures within an interval of 5,5-300 K are achieved by blowing of helium vapor from liquid helium heated by an electric furnace, which is controlled by a temperature stabilizer. Temperatures within a range of 1,2-4,2 K are achieved by pumping out of the helium vapor.

Then the electrometric method was applied. The set-up for the measuring of electric field dependence by this technique contains electrometric voltmeter VC2-16, high-voltage source and condenser with small leakage current.

Figure 2:
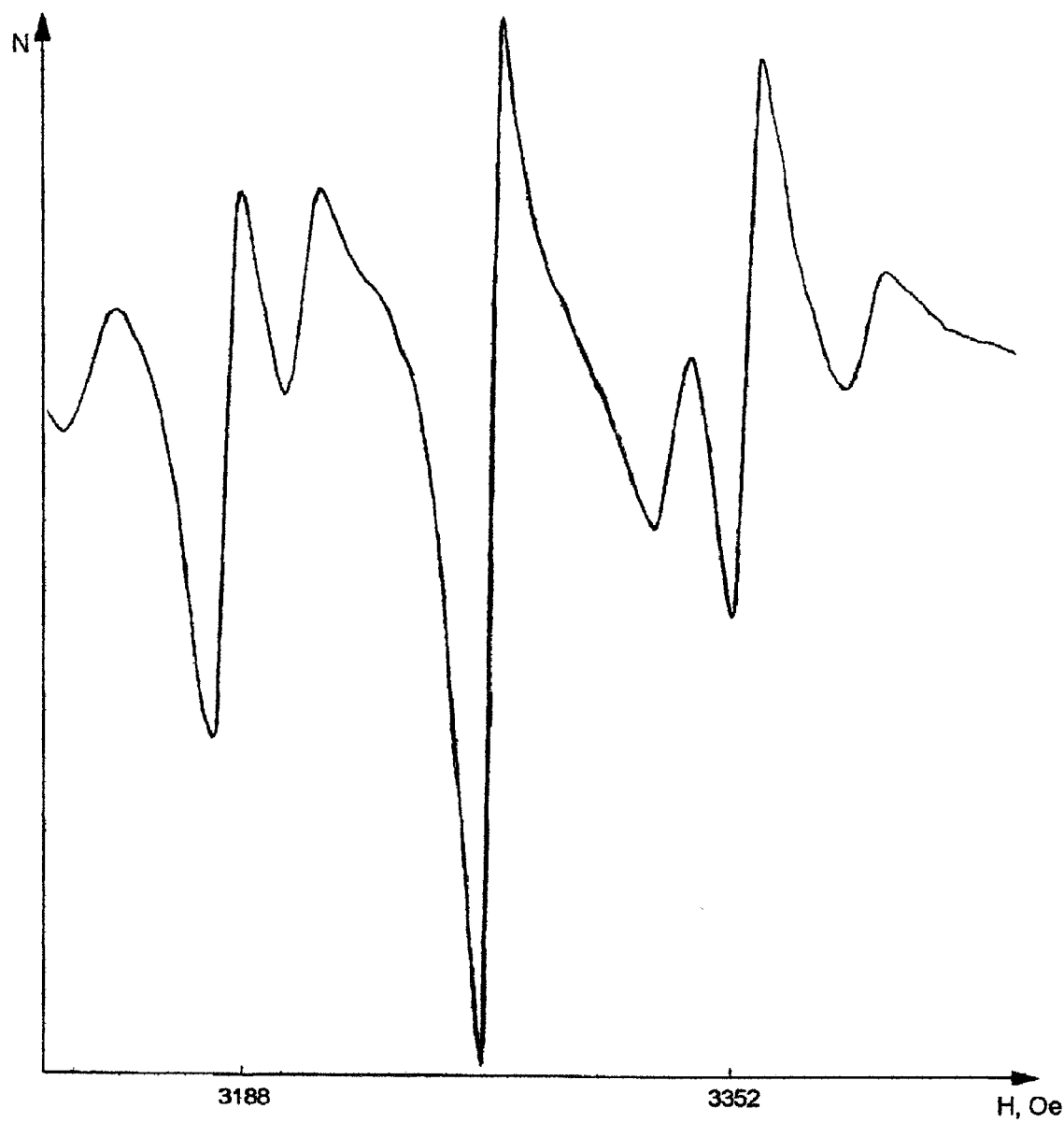
FIG. 2 depicts an EPR spectrogram of the single crystal of potassium tantalate doped with gadolinium, $KTaO_3:Gd^{3+}$.
Figure 2A:
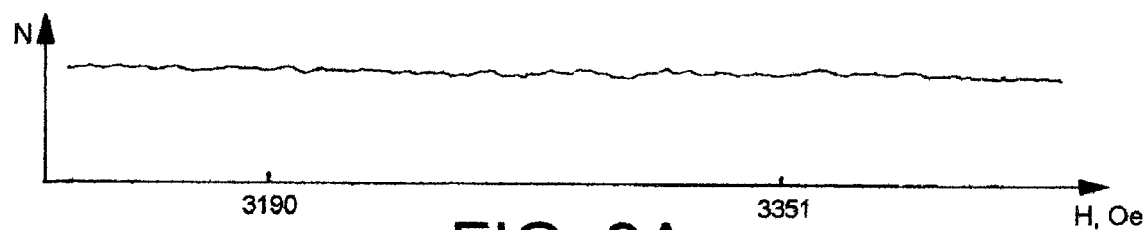
FIG. 2A depicts an EPR spectrogram of the single crystal of potassium tantalate, $KTaO_3$.

Quality of the crystals was tested by means of EPR technology. The crystals doped with either $Mn^{2+}$ or $Gd_{3+}$ were measured with EPR spectrometers RE-1301 and RE-1307. A line width of the dopant that narrower than 10 Oe is an evidence of a good quality and purity of crystals. The extremely small amount of defects (fewer than $10^{15} 1/cm^3$) can be detected by broadened EPR line. A graph (FIG. 2) is the EPR spectrogram of the control single crystal of present invention doped with $Gd_{3+}$ in a magnetic field intensity axis (H) and a relative number of counts axis (N), which demonstrates a narrow $Gd^{3+}$ line in the crystal. A graph (FIG. 2A) is the EPR spectrogram of the single crystal of certain embodiments of the present invention shows absence of detectable impurities and fewer than $10^{11} 1/cm^3$ paramagnetic defects. This constitutes one defect for about $10^9$ to $10^{13}$ atoms, which means the essentially defect free crystal.

Figure 3:
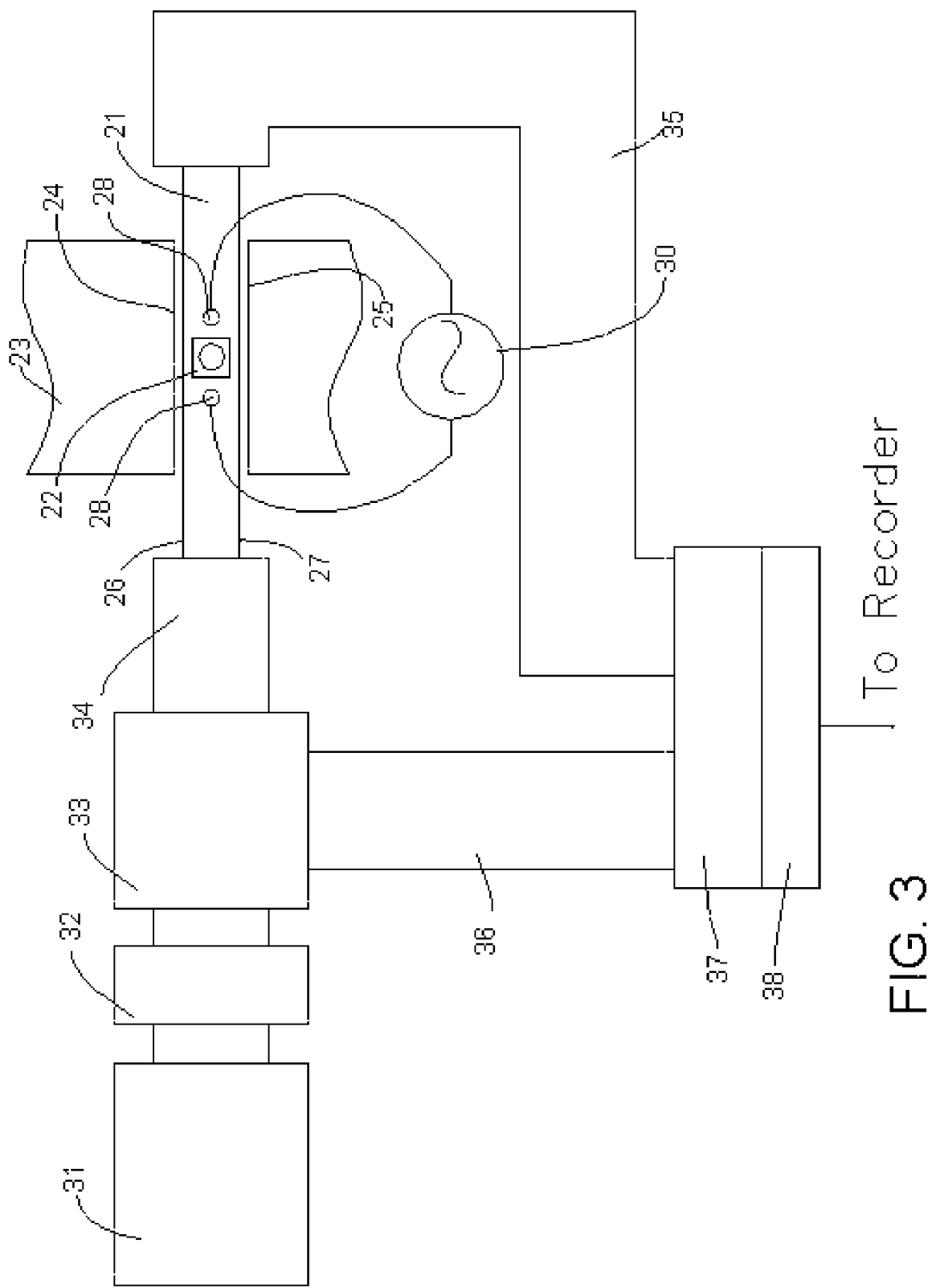
FIG. 3 depicts a schematic representation of the EPR spectrometer.
Figure 4:
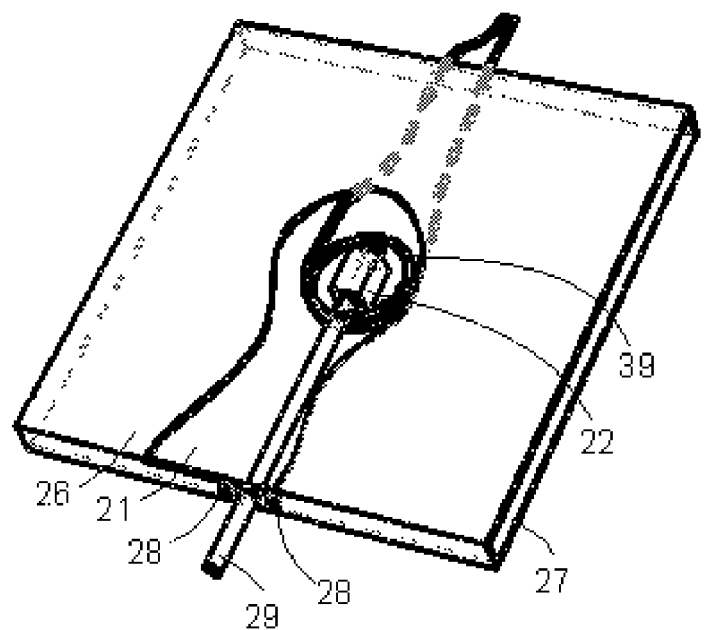
FIG. 4 depicts a partially cut out part of the channel with the single crystal resonator.

Referring to FIG. 3, in some embodiments, the EPR spectrometer includes a channel 21 with a hollow ferroelectric resonator 22, located in a gap between poles 24 and 25 of a permanent magnet 23. The poles 24 and 25 are in close proximity and parallel to wide sides correspondingly 26 and 27 of the channel 21, which also has connection holes 28 through its narrow sides. Wires from AC generator 30, which typically has a frequency on the order of 100 KHz, are connected trough the holes 28 to a coil 39 (FIG. 4). A waveguide 34 connects the channel 21 to a microwave generator 31 through a valve 32 and a directed branching 33. The channel 21 and the branching 33 are connected through waveguides correspondingly 35 and 36 to a diode detector 38 through a balance mixer 37. A sample holder 29 (FIG. 4) is inserted in the resonator 22 through the corresponding channel hole.

The holder 29 may be either a capillary containing a liquid sample or a rod with a glued on solid sample to be analyzed by EPR spectroscopy techniques. Microwave energy is coupled to the channel 21 and the resonator 22 from the microwave generator 31 through the valve 32, the branching 33, and the waveguide 34. For purpose of this application, the microwave generator 31 having a noise spectrum comparable to a Gunn oscillator, is used. In one of the embodiments of the invention, the Gunn oscillator having a frequency of 9.4 GHz was employed to excite the cylindrical ferroelectric resonator to the $TM_{11}\delta$ mode. The ferroelectric resonator had the diameter of 1.9 mm and the height 3 mm with a hole of Ø0.9 mm. The flux from a relatively strong magnetic field that includes DC component of the permanent magnet 23 on which small AC component is imposed extends in the channel 21 and in the resonator 22. Because of the small gap between the poles 24 and 25, the magnet's 15 size and weight are reduced. The AC magnetic field component is provided by AC generator 30 and the coil 39 connected by the wires the inserted in the holes 28. The coil 39 may comprise either single or multiple loops. Depending on a particular design of the coil 39, the wires can be inserted either through one or both narrow sides of the channel 21. The energy from the resonator 22 and the channel 21 through the waveguide 35, as well as the energy directly from the generator 31 through the waveguide 36 is coupled to the balance mixer 37 and detected by diode detector 38. A signal derived from the detector 38 is fed to a suitable output device, such as a chart recorder. As is well known, when resonance occurs in the sample, the energy from the resonator provides a finite output from the diode detector 38.

It has been found that the sensitivity of the EPR spectrometer disclosed herein is, typically, 50 times higher than that obtained from high Q cavities of conventional design. This result can be understood when one recognizes that the sensitivity is proportional to the product of a filling factor ($\eta$) and the cavity Q. Furthermore, $\eta$ is proportional to $\epsilon$ of the resonator and inversely proportional to $\epsilon$ of the cavity. Moreover, if the sample dimensions are held constant, it is apparent that $\eta$ is inversely proportional to the cavity dimension corresponding to the zero ($TE_{10}$) index. Thus the product $\eta Q$ is increased greatly.

The homogeneity of the magnetic field for a fixed magnet pole piece diameter and fixed field improves as the magnet gap is decreased and the area of the required homogeneity becomes smaller. For the fixed magnetic field the required number of ampere turns decreases as the gap decreases. Accordingly, the magnet size required in order to avoid magnetic saturation of the iron is smaller for a smaller number of the ampere turns. An approximate rule of thumb is that the weight of a magnet of constant pole piece diameter and the constant magnetic field intensity varies in proportion to the third power of the magnet gap. Generally, it is true for a permanent magnet also. According to many embodiments of the present invention embodiments, the gap between the poles 24 and 25 is approximately 3 mm with a resulting weight of the permanent magnet 23 of approximately 0.6 kg. In conventional prior art even in rectangular configurations, the gap is greater than 17 mm requiring a magnet weight in excess of 100 kg.

Thus, the EPR spectrometer disclosed herein affords, on orders of magnitude, an increase in sensitivity, a decrease of the incident microwave power required, a reduction of the weight and the size, and eliminating cooling media and devices. In other words, various implementations of the present invention embody a truly portable, suitcase sized EPR spectrometer having weight under 15 kg with capabilities of many times its size and price research spectrometers.

Figure 5:
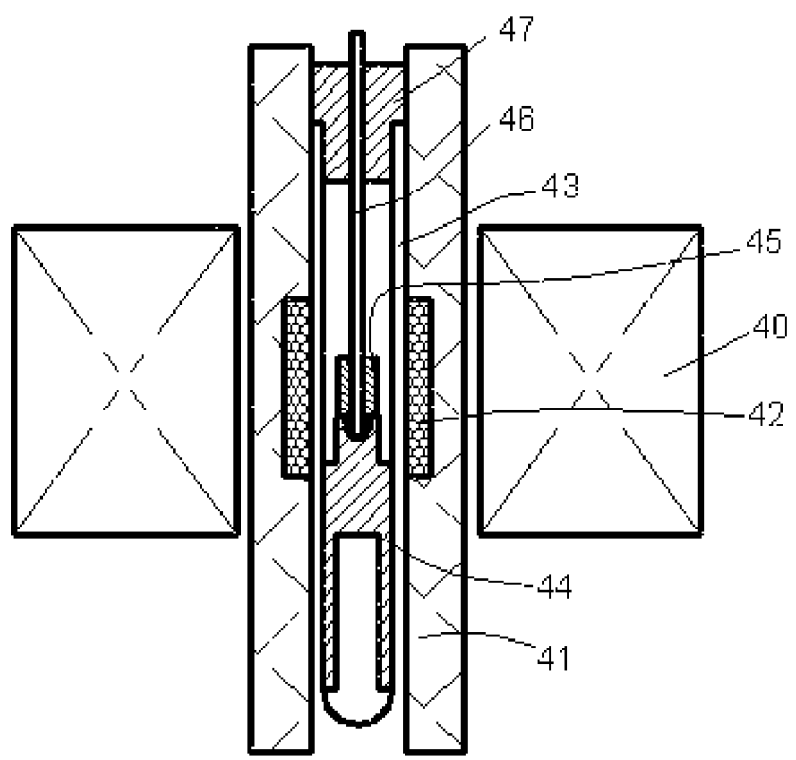
FIG. 5 depicts a schematic representation of the NMR spectrometer concept according to present invention.

The NMR spectrometer (FIG. 5) comprises a hollow magnet 40 generating a static magnetic field, a tubular probe 41 with a RF magnetic pulse transmitter/receiver 42 disposed in the magnet 40 hole, a holder 43, and a ferroelectric single crystal resonator 45. A cap 47 positions the holder 43 and a sample 46 within the probe 41. A support 44 situates the resonator 45 and defines the sample 46 placement within the resonator 45. The probe 41, the holder 43, the resonator 45, and, accordingly, the sample 46 are coaxial with the static magnetic field. Furthermore, the RF magnetic pulse transmitter/receiver 42 and the resonator 45 are disposed in the most homogeneous zone of the static magnetic field.

In one embodiment of the present invention the holder 43 with the support 44, the resonator 45, the sample 46, and the cap 47 is used as an insert with conventional NMR spectrometer. In this embodiment an RF coil of the spectrometer serves as the RF magnetic pulse transmitter/receiver 42. In a particular instant, the resonator 45 was a single crystal of $KTaO_3$ with dimensions approximately 6×6×7 mm and had a hole of about 1 mm in diameter along a 7 mm axis. The resonator 45 own resonant frequency was 1200 MHz and the RF coil resonant frequency and, accordingly, frequency of the spectrometer was 400 MHz. The liquid sample 46 was placed in a capillary of 1 mm in diameter. The insert presence increased signal-to-noise ratio in hydrogen NMR spectra in about 10 times.

In another instant, the resonator 45 having the resonant frequency of 9000 MHz was used with the spectrometer working at the frequency of 300 MHz. This combination yielded only doubling of the signal-to-noise ratio. According to various embodiments of the present invention, the resonator 45 having own resonant frequency, which is multiple of frequency of the NMR spectrometer, increases sensitivity of the spectrometer. The greatest increase of the signal-to-noise ratio occurs when the resonator 45 own resonant frequency is equal to the frequency of the NMR spectrometer. The sensitivity, in this case, is expected to be up to 50 times higher.

In another embodiment of the present invention, the NMR spectrometer has the magnet 40 that is a superconducting magnet, the holder 43 that is a part of the probe 41, the RF magnetic pulse transmitter/receiver 42 that is a loop, and the resonator 45 that is capable of generating the pulse magnetic field perpendicular to the static magnetic field. As is well known, in general, in NMR spectrometers the magnetic pulse field generated by the RF coil is perpendicular to a static magnetic field. Methods to calculate parameters of the resonator 45 so the magnetic pulse field is perpendicular to a static magnetic field are, also, well known in the art. The spectrometer described is capable of utilizing higher frequency than spectrometers with RF coils.

In yet another embodiment of the present invention, the simplified NMR spectrometer has the magnet 40 that is permanent magnet with a relatively small center hole (20 to 30 mm), the holder 43 that is a part of the probe 41, the RF magnetic pulse transmitter/receiver 42 that is a loop, and the resonator 45 that is capable of generating the pulse magnetic field perpendicular to the static magnetic field.

Thus, according to many embodiments of the present invention, the NMR spectrometer affords either radical improvement of a spectrogram quality by increasing sensitivity and the working frequency or a decrease of the power required, a reduction of the weight and the size.

Although the description above contains much specificity, it should not be construed as limiting the scope of the invention but as merely providing illustrations of some of the presently preferred embodiments of this invention. Thus the scope of the invention should be determined by the appended claims and their legal equivalents, rather than by the examples given. It will be apparent to those skilled in the art that various modifications and variations can be made to the above-described structure and methodology without departing from the scope or spirit of the invention.

What is claimed is:

1. An EPR spectrometer comprising: a channel; having generally opposing wide sides; and narrow sides; a sample hole through at least one of said narrow sides; at least one connection hole through at least one of said narrow sides; a polarizing magnet; having first and second poles having at least one substantially planar surface, a ferroelectric single crystal resonator; having a through hole; and a coil disposed within said channel generally surrounding the resonator; wherein said polarizing magnet disposed generally over said channel such that said substantially planar surfaces of said first and second poles are disposed substantially parallel and in close proximity to each of said wide sides, said ferroelectric single crystal resonator disposed within said channel generally between said first and second poles with said through hole substantially coaxial with said sample hole for receiving a sample there through, and said coil being in electric communication with a modulation source through connecting wires passing through said at least one connection hole.

2. The EPR spectrometer according to claim 1, wherein said narrow sides are substantially perpendicular to said opposing wide sides.

3. The EPR spectrometer according to claim 2, wherein said ferroelectric single crystal resonator is a single crystal comprising the potassium tantalite.

4. The EPR spectrometer according to claim 3, wherein said single crystal further comprises lithium substituting for from about 1% to about 3% of potassium, thereby forming a $K_{(0.97-0.99)}Li_{(0.03-0.01)}TaO_3$ composition of said single crystal.

5. The EPR spectrometer according to claim 1, wherein said ferroelectric single crystal resonator characterized by a shape substantially symmetrical relative to three mutually perpendicular planes and axes.

6. The EPR spectrometer according to claim 1, further comprising a microwave generator having a predetermined noise spectrum for supplying energy to the resonator.

7. The EPR spectrometer according to claim 6, further comprising means for detecting the electron paramagnetic resonance of a sample.

8. The EPR spectrometer according to claim 6, further comprising a balance mixer coupled to a detector diode for detecting the electron paramagnetic resonance of a sample.

9. The EPR spectrometer according to claim 7, further comprising means for branching microwave energy from said microwave generator to said ferroelectric single crystal resonator and from said microwave generator to said means for detecting the electron paramagnetic resonance of said sample.

10. The EPR spectrometer according to claim 9, further comprising means for conducting microwave energy from said means for branching microwave energy to said ferroelectric single crystal resonator, from said ferroelectric single crystal resonator to said means for detecting the electron paramagnetic resonance of said sample, and from said means for branching microwave energy to said means for detecting the electron paramagnetic resonance.

11. The EPR spectrometer according to claim 9, further comprising first and second wave guides for connecting said channel to said means for branching microwave energy and said means for detecting the electron paramagnetic resonance and a third wave guide for connecting said means for branching microwave energy to said means for detecting the electron paramagnetic resonance.

12. A NMR spectrometer comprising: a magnet for generating a static homogeneous magnetic field; a probe disposed within said homogeneous magnetic field and having means for transmitting a radio frequency magnetic pulse and detecting NMR signal; and a ferroelectric single crystal resonator positioned within said probe; having a through hole for receiving a sample there through, wherein a ratio of a resonant frequency of said ferroelectric single crystal resonator and the NMR spectrometer frequency is substantially an integer.

13. The NMR spectrometer according to claim 11, wherein said ferroelectric single crystal resonator characterized by a shape substantially symmetrical relative to three mutually perpendicular planes and axes.

14. The NMR spectrometer according to claim 11, wherein said probe has an axis anti said probe, said ferroelectric single crystal resonator, and said hole are substantially coaxial with an axis of said static homogeneous magnetic field.

15. The NMR spectrometer according to claim 11, wherein said ferroelectric single crystal resonator is a single crystal comprising the potassium tantalite, in which a part of the tantalum is substituted with the group (V) metal.

16. The NMR spectrometer according to claim 11, wherein said group (V) metal is niobium, said niobium substitutes of up to about 40% of tantalum, thereby forming a $KNb_{(0-0.4)}Ta_{(1-0.6)}O_3$ composition.

17. The NMR spectrometer according to claim 15, wherein up to 0.1% of potassium in said single crystal is substituted with lithium.

* * * * *